United States Patent
Chen et al.

(10) Patent No.: US 9,837,425 B2
(45) Date of Patent: Dec. 5, 2017

(54) SEMICONDUCTOR DEVICE WITH SPLIT GATE FLASH MEMORY CELL STRUCTURE AND METHOD OF MANUFACTURING THE SAME

(71) Applicant: UNITED MICROELECTRONICS CORP., Hsinchu (TW)

(72) Inventors: Aaron Chen, Singapore (SG); Chi Ren, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/132,574

(22) Filed: Apr. 19, 2016

(65) Prior Publication Data
US 2017/0301683 A1    Oct. 19, 2017

(51) Int. Cl.
| H01L 29/66 | (2006.01) |
| H01L 27/11521 | (2017.01) |
| H01L 29/788 | (2006.01) |
| H01L 29/06 | (2006.01) |
| H01L 29/423 | (2006.01) |

(52) U.S. Cl.
CPC .... H01L 27/11521 (2013.01); H01L 29/0649 (2013.01); H01L 29/4236 (2013.01); H01L 29/6656 (2013.01); H01L 29/66545 (2013.01); H01L 29/66825 (2013.01); H01L 29/7881 (2013.01)

(58) Field of Classification Search
None
See application file for complete search history.

(56) References Cited

U.S. PATENT DOCUMENTS

| 8,901,632 B1 | 12/2014 | Perera et al. |
| 9,548,312 B1* | 1/2017 | Beyer ............... H01L 27/11524 |
| 2015/0364558 A1 | 12/2015 | Wu et al. |
| 2016/0013197 A1* | 1/2016 | Liu ..................... H01L 27/1157 257/322 |
| 2016/0240622 A1* | 8/2016 | Fan ................... H01L 29/42328 |

* cited by examiner

*Primary Examiner* — Daniel Whalen
(74) *Attorney, Agent, or Firm* — WPAT, PC

(57) ABSTRACT

A semiconductor device with split gate flash memory cell structure includes a substrate having a first area and a second area, at least a first cell formed in the first area and at least a second cell formed in the second area. The first cell includes a first dielectric layer formed on the substrate, a floating gate (FG), a word line and an erase gate (EG) formed on the first dielectric layer, an interlayer dielectric (ILD) layer, an inter-gate dielectric layer and a control gate (CG). The FG is positioned between the word line and the EG, and the ILD layer is formed on the word line and the EG, wherein the ILD layer has a trench exposing the FG. The inter-gate dielectric layer is formed in the trench as a liner, and the CG formed in the trench is surrounded by the inter-gate dielectric layer.

17 Claims, 6 Drawing Sheets

SEMICONDUCTOR DEVICE WITH SPLIT GATE FLASH MEMORY CELL STRUCTURE AND METHOD OF MANUFACTURING THE SAME

BACKGROUND

Technical Field

The disclosure relates in general to a semiconductor device and a method of manufacturing the same, and more particularly to a semiconductor device with split gate flash memory cell structure and a method of manufacturing the same.

Description of the Related Art

Size of semiconductor device has been decreased for these years. Reduction of feature size, improvements of the rate, the efficiency, the density and the cost per integrated circuit unit are the important goals in the semiconductor technology. The electrical properties of the device have to be maintained even improved with the decrease of the size, to meet the requirements of the commercial products in applications. For example, the layers and components with damages, which have considerable effects on the electrical performance, would be one of the important issues of the device for the manufacturers. Generally, a semiconductor device with good electrical performance requires the elements (such as gates) with complete profiles.

According to the typical manufacturing method for forming the semiconductor devices such as the logic cells and the flash memory cells on the substrate, the gate heights of the logic cells and the flash memory cells are different and the manufacturing process would cause damage to the gates (ex: control gates) of the flash memory cells. It is known that the elements such as the control gates of the memory cells of the semiconductor device with flawed profiles and insufficient gate heights will cause considerable deterioration on the electrical properties of the semiconductor device. It is thus desirable to conquer the gate height issue by developing a manufacturing method compatible with processes of forming different gate-height cells in the different areas of the substrate.

SUMMARY

The disclosure is directed to a semiconductor device with split gate flash memory cell structure and a method of manufacturing the same. The proposed structure and method of the present embodiments provide a way for effectively preventing the gates from damage (ex: the control gate of the flash memory cell) no matter what gate height difference between the first cells and second cells in different areas of the substrate.

According to one aspect of the present disclosure, a semiconductor device with split gate flash memory cell structure is provided, including a substrate having a first area and a second area, at least a first cell formed in the first area, and at least a second cell formed in the second area. The first cell includes a first dielectric layer formed on the substrate, a floating gate (FG), a word line and an erase gate formed on the first dielectric layer, an interlayer dielectric (ILD) layer, an inter-gate dielectric layer and a control gate (CG). The FG is positioned between the word line and the erase gate, and the ILD layer is formed on the word line and the erase gate, wherein the ILD layer has a trench exposing the floating gate. The inter-gate dielectric layer is formed in the trench as a liner, and the CG is formed in the trench and surrounded by the inter-gate dielectric layer.

According to another aspect of the present disclosure, a method for manufacturing a semiconductor device with split gate flash memory cell structure is provided. A silicon substrate having a first area and a second area is provided. At least a first cell with the aforementioned structure is formed on the substrate at the first area, and at least a second cell is formed on the substrate at the second area.

Figure 1:
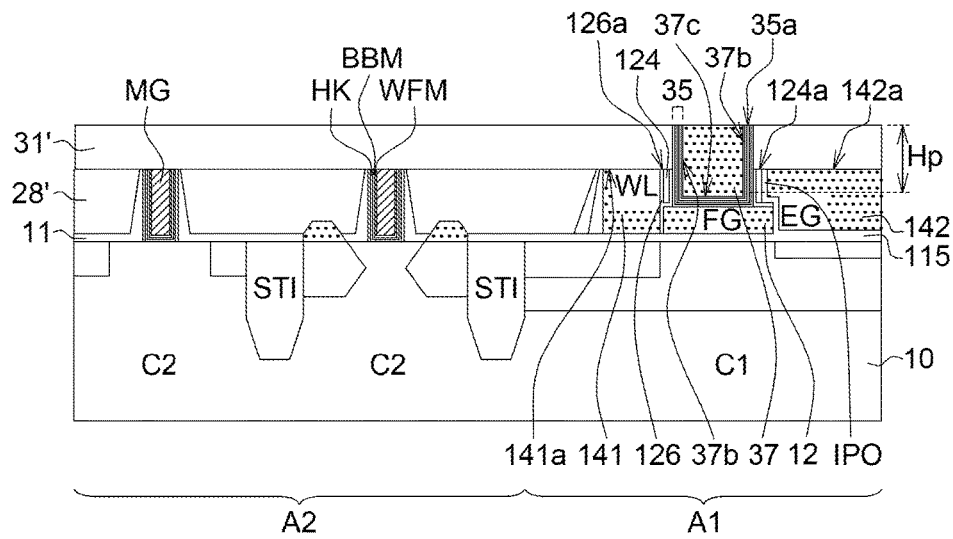
FIG. 1 illustrates a semiconductor device with split gate flash memory cell structure according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the embodiment of the present disclosure, a semiconductor device with split gate flash memory cell structure and a method of manufacturing the same are provided. According to the disclosure, a semiconductor device having gates with complete profiles and sufficient heights in the different regions can be obtained. Also, it is no need to consider the gate height loses or damages to the first cells (i.e. the flash memory cells) in the first area during formation of the second cells (i.e. the logic cells) in the second area, no matter what gate height difference between the first cells and the second cells.

The embodiments can be applied to manufacture different types of semiconductor devices having no-damaged gates in the different regions, such as the semiconductor devices having logic cells with 28 nm high-k metal gate (HKMG) or Fin-FET. Embodiments are provided hereinafter with reference to the accompanying drawings for describing the related procedures and configurations. For example, a semiconductor device having the HKMG logic cells and the CG (control gate)-last flash memory cells are exemplified for illustration. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", "third" etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

FIG. 1 illustrates a semiconductor device with split gate flash memory cell structure according to one embodiment of the disclosure. As shown in FIG. 1, a substrate 10 (such as silicon substrate) having a first area A1 comprising several first cells C1 and a second area A2 comprising several second cells C2 is provided. According to the embodiment, the first area A1 can be a flash area to form the flash memory cells (i.e. the first cells) subsequently for data storage, and the second area A2 can be a logic area (i.e. the second cells) to form the logic cells (ex: with 28 nm high-k metal gate (HKMG)) for logical operation. In practical application, a semiconductor device includes several flash memory cells, but the drawings (such as FIG. 1 and manufacturing method of FIG. 2A-FIG. 2J) only schematically show one flash memory cell for the purpose of clear demonstration. Also, the split gate flash memory cell structure having a control gate on a floating gate is exemplified in the embodiment.

As shown in FIG. 1, the first cell C1 includes a first dielectric layer 11 formed on the substrate 10, a floating gate (FG) 12, a word line (WL) 141 and an erase gate (EG) 142 formed on the first dielectric layer 11, an interlayer dielectric (ILD) layer 31' formed on the word line 141 and the erase gate 142, wherein the floating gate 12 is positioned between the word line 141 and the erase gate 142, and the ILD layer 31' has a trench extending downward to expose the floating gate 12. Also, the first cell C1 of the embodiment further includes an inter-gate dielectric layer 35 formed in the trench as a liner, and a control gate (CG) 37 formed in the trench and surrounded by the inter-gate dielectric layer 35. For example, the inter-gate dielectric layer 35 directly contacts the opposite sidewalls 37b and a bottom surface 37c of the control gate (CG) 37. According to the embodiment, a top surface 35a of the inter-gate dielectric layer 35 is aligned (or coplanar) with a top surface 37a of the control gate (CG) 37, as shown in FIG. 1.

Also, the first cell C1 further includes the CG spacers 124 and the WL spacer 126. The CG spacers 124 are formed on the floating gate (FG) 12 and abutting the opposite sidewalls of the inter-gate dielectric layer 35 (ex: running vertically along the opposite sidewalls of the inter-gate dielectric layer 35), wherein the ILD layer 31' is formed on the top surfaces of the CG spacers 124. The WL spacer 126 is formed between the word line (WL) 141 and the floating gate (FG) 12. The WL spacer 126 abuts the sidewalls of the FG 12 and the CG spacer 124 for electrically isolating the word line 141 and the FG 12. Also, the top surface 141a of the WL spacer 126 is aligned (or coplanar) with the top surfaces 124a of the CG spacers 124. In one embodiment, the top surfaces 124a of the CG spacers 124 and the top surface 141a of the word line 141 are aligned (or coplanar) with the top surface 142a of the erase gate 142, but those elements (i.e. the word line 141, the CG spacers 124 and the erase gate 142) of the embodiment are positioned at a lower horizontal level than the control gate 37 and the inter-gate dielectric layer 35. As shown in FIG. 1, a top surface of the inter-gate dielectric layer 35 and a top surface 37a of the CG 37 are higher than the top surfaces 124a of the CG spacers 124.

Comparing the gate structures of the first cell C1 and the second cell C2, the top surface 37a of the CG 37 and the top surface 35a of the inter-gate dielectric layer 35 are higher than the top surface of the gate (such as metal gate MG) of the second cell C2. Both of the gate structures of the first cell C1 and the second cell C2 possess complete profile and sufficient gate height. In one embodiment, a height of the control gate (CG) 37 is at least about two times of a height of the CG spacers 124. For example, the height of the control gate (CG) 37 could be 500 Å while the height of the of the CG spacers 124 could be 250 Å, approximately.

In one embodiment, the inter-gate dielectric layer 35 includes an oxide layer 351, a nitride layer 352 and another oxide layer 353, which can be referred as an ONO layer. In one embodiment, the first dielectric layer 11 can be an oxide layer, and a portion of the first dielectric layer 11 under the floating gate (FG) 12 functions as a FG oxide. The CG spacers 124 could be a multi-layer including an oxide layer 1241 and a nitride layer 1242. Also, a sacrificial oxide layer 115 is formed beneath the erase gate (EG) 142, wherein the sacrificial oxide layer 115 (ex: 150) is thicker than the FG oxide under the floating gate (FG) 12.

FIG. 2A-FIG. 2J illustrate a method for manufacturing a semiconductor device with split gate flash memory cell structure according to one embodiment of the disclosure. The identical elements of FIG. 2A-FIG. 2J and FIG. 1 are designated with the same reference numerals for the purpose of clear illustration. Also, the numerical values (such as the thicknesses) of the related elements are provided for illustration, not for the limitation, and it is known that the configuration of the related elements can be adjusted and chosen to determine the appropriate numerical values.

Figure 2A:
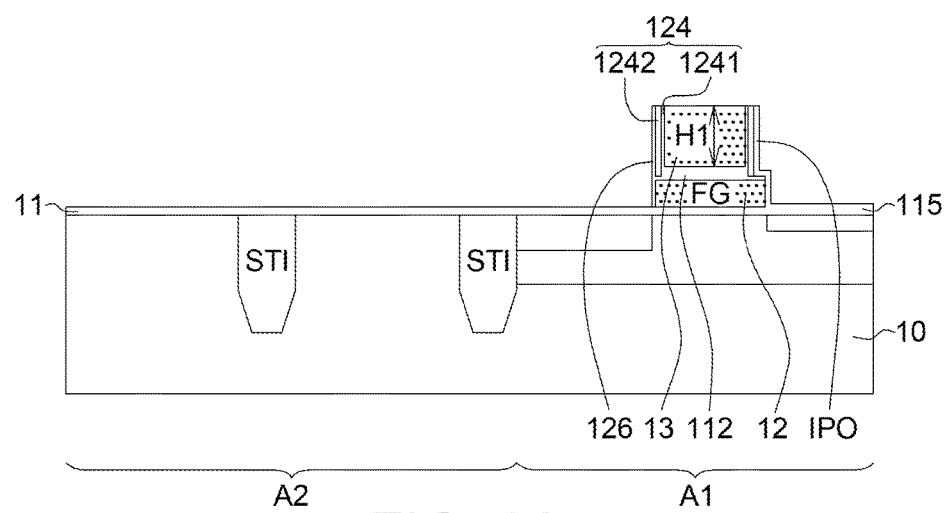
FIG. 2A-FIG. 2J illustrate a method for manufacturing a semiconductor device with split gate flash memory cell structure according to one embodiment of the disclosure.

First, a substrate 10 having a first area A1 and a second area A2 is provided, followed by forming parts of a first cell (ex: flash memory cell), such as forming the first dielectric layer 11 on the substrate 10, the floating gate (FG) 12 on the first dielectric layer 11, a FG capping oxide 112 on the floating gate 12, a dummy control gate 13 (with a first height H1) on the FG capping oxide 112, the CG spacers 124 adjacent to the sidewalls of the dummy control gate 13, the WL spacer 126 adjacent to the sidewalls of the floating gate 12 and the CG spacers 124, the inter-poly oxide (IPO) layer, and the sacrificial oxide layer 115, as shown in FIG. 2A. In one embodiment, the thicknesses of the dummy control gate 13, the FG capping oxide 112, the floating gate 12, the first dielectric layer 11 and the sacrificial oxide layer 115 are (but not limited to) about 500 Å, 150 Å, 200 Å, 70 Å and 150 Å, respectively.

Figure 2B:
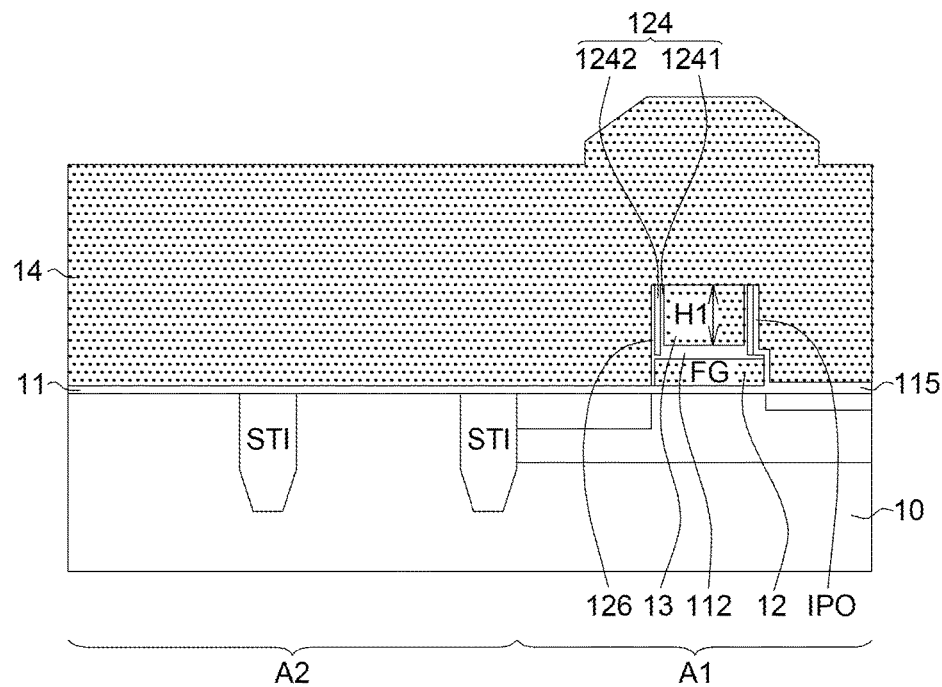
Figure 2C:
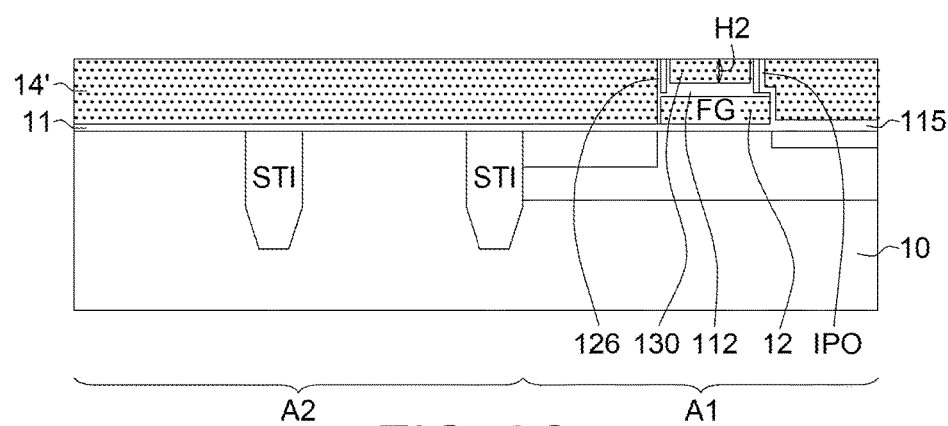

Then, a first conductive layer 14 is deposited on the first dielectric layer 11, wherein the dummy control gate 13 with the first height H1, the floating gate 12, and the CG spacers 124 are embedded in the first conductive layer 14, as shown in FIG. 2B. Subsequently, the first conductive layer 14 is partially removed (such as by chemical mechanical polishing, CMP) until defining the word line (WL) and the erase gate (EG) with predetermined heights (ex: $H_{WL}$ and $H_{EG}$) as shown in FIG. 2C. After polishing, the remaining dummy control gate 130 has the second height H2 (such as about 180 Å). The second height H2 (FIG. 2C) is smaller than the first height H1 (FIG. 2A). In one embodiment, the first conductive layer 14 (ex: to form the WL and EG subsequently) is made of polysilicon.

Figure 2D:
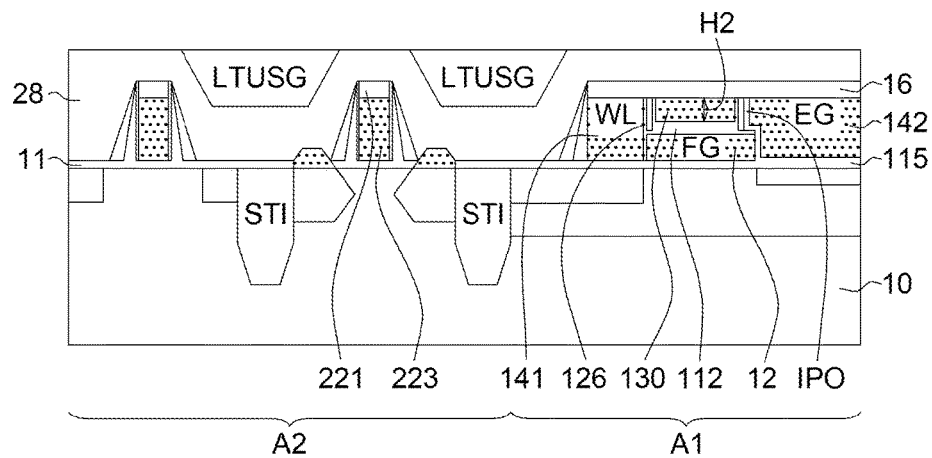

Afterwards, construction of the first cell C1 in the first area A1, followed by formation of the second cells (ex: logic cells) in the second area A2 are conducted. For example, other elements of the first cell C1, such as a protective layer 16 (covering the dummy control gate 130, the word line 141 and the erase gate 142) and the spacers covering the sidewall of the word line 141, are formed, as shown in FIG. 2D. Then, formation of the second cells C2 (ex: logic cell) is performed, including formation of a polysilicon gate 223 and a silicon nitrite 221 on the polysilicon gate 223, and formation of other known elements such as spacers (besides the polysilicon gate 223 and the silicon nitride 221) and the low temperature USG (LTUSG) in the insulating layer 28, as shown in FIG. 2D. In FIG. 2D, the insulating layer 28 also covers the protective layer 16 of the first cell C1.

Figure 2E:
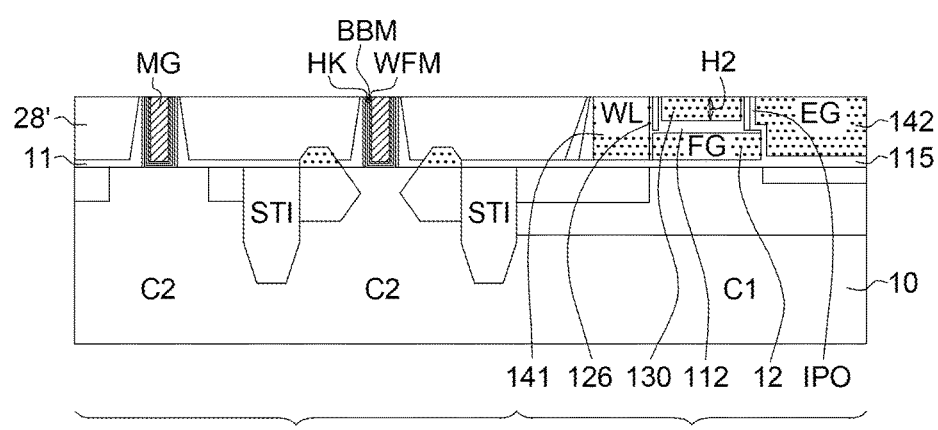

Then, formation of the second cell C2 comprising a gate electrode (such as metal gate formed on a high-k dielectric film, or FinFET) is performed. For example, in the HKMG logic application, the polysilicon gate 223 and the silicon nitride 221 of the second cells C2 in FIG. 2D are replaced by the metal gate MG with the high-k dielectric film HK under, as shown in FIG. 2E. Details of the known elements of the flash memory cell, such as the high-k dielectric film HK, the bottom barrier metal BBM and work function metal WFM of the gate electrode and related isolations such as STI and so on, are not redundantly described herein. In one embodiment, a top surface of the gate electrode such as metal gate MG is aligned (or coplanar) with the top surfaces 124a of the CG spacers 124.

Figure 2F:
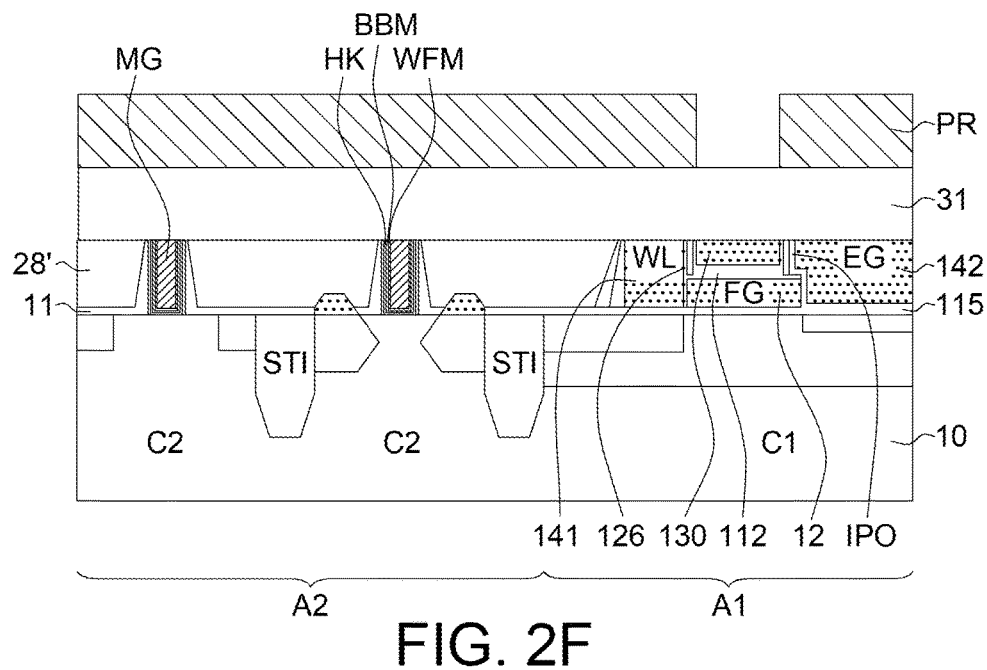
Figure 2G:
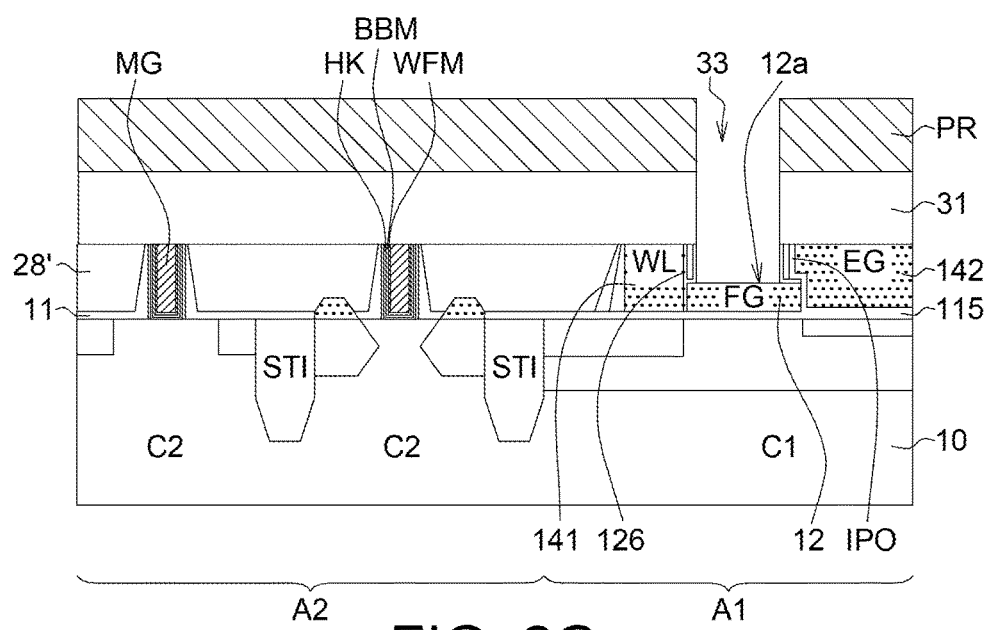

Afterwards, formation of a control gate (CG) is conducted. As shown in FIG. 2F, an ILD layer 31 (ex: TEOS) is deposited on the word line 141, the erase gate 142 and the dummy control gate 130 (with the second height H2), followed by forming a patterned photo-resist layer PR. The, a trench 33 is formed in the ILD layer 31 and extends downwardly according to the patterned photo-resist layer PR, so as to remove the dummy control gate 130 with the second height H2 as well as the FG capping oxide 112, so as to expose a top surface 12a of the floating gate 12, as shown in FIG. 2G. Thus, according to the method described herein, the step of forming the second cell C2 comprising a gate electrode (ex: metal gate MG) formed above the substrate 10 is performed after polishing the first conductive layer 14 and before formation of the ILD layer 31.

Figure 2H:
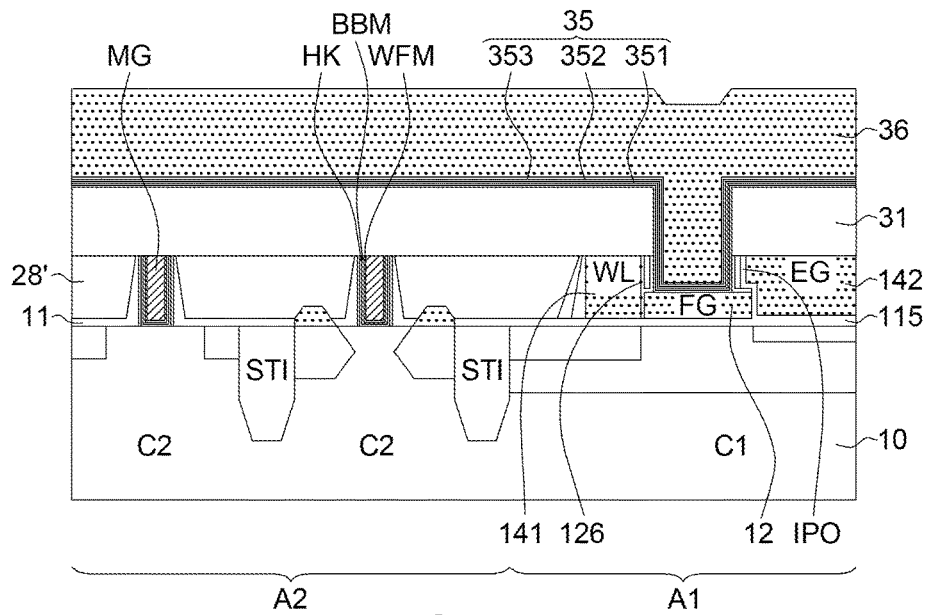

Next, an inter-gate dielectric layer 35 (ex: an oxide-nitride-oxide (ONO) multilayer) is formed on the ILD layer 31 and deposited in the trench 33 as a liner of the trench 33. Also, a second conductive layer 36 is deposited on the inter-gate dielectric layer 35 and fully fills the trench 33, as shown in FIG. 2H. The second conductive layer 36 and the first conductive layer 31 can be made of the same material or different materials. In one embodiment, the second conductive layer 36 (ex: to form the control gate subsequently) is made of polysilicon. Also, in one embodiment, the thicknesses of the ILD layer 31 (ex: TEOS) and the second conductive layer 36 in FIG. 2H can be about 800 Å and 2000 Å, approximately. However, those numerical values of thicknesses are provided merely for illustration (not for the limitation), and those thicknesses can be adjusted and chosen so that the ILD layer 31 is thick enough for forming the control gate 37 with a predetermined height Hp to meet the product requirement of the application, and the second conductive layer 36 is thick enough for fully filling up the trench 33 and capable of being polished in the subsequent planarization processes.

Figure 2I:
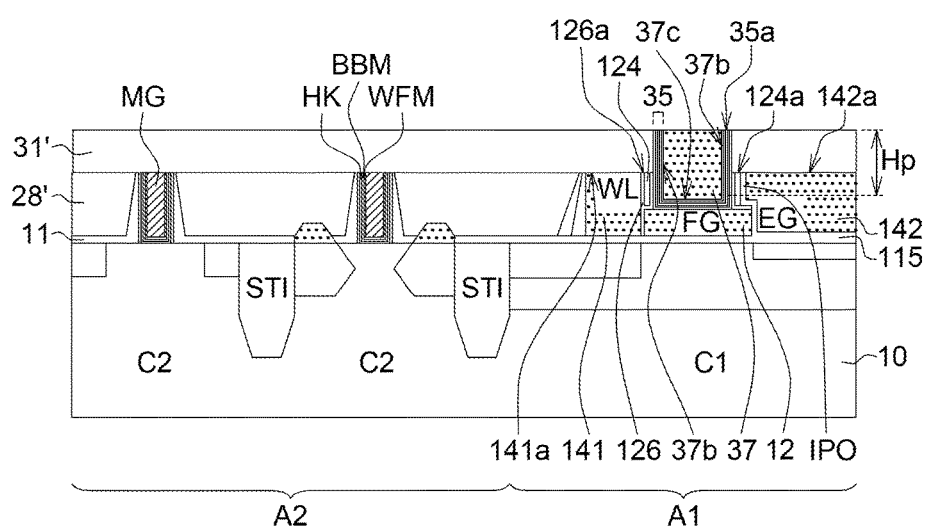

Subsequently, a planarization step is conducted to form a control gate with a predetermined height. As shown in FIG. 2I, the second conductive layer 36 is polished until the portion of the inter-gate dielectric layer 35 on the ILD layer 31' being removed, so as to form the control gate 37 with a predetermined height Hp (such as 500 Å) to meet the product requirement of the application.

As shown in FIG. 2I, the top surface 35a of the inter-gate dielectric layer 35 is substantially aligned (or coplanar) with the top surface 37a of the control gate (CG) 37, and is aligned (or coplanar) with the top surface of the ILD layer 31' after planarization step. After formations of the second cells C2 in the second area A2 and the first cells C1 in the first area A1, relative contacts and metal connections can be formed subsequently. For example, in the subsequently processes, more dielectric material is deposited on the ILD layer 31' to form a thicker ILD layer 31P, followed by forming the contacts 32 in the thicker ILD layer 31P to connect the gates of the first cell C1 and the second cells C2, as shown in FIG. 2J.

Figure 2J:
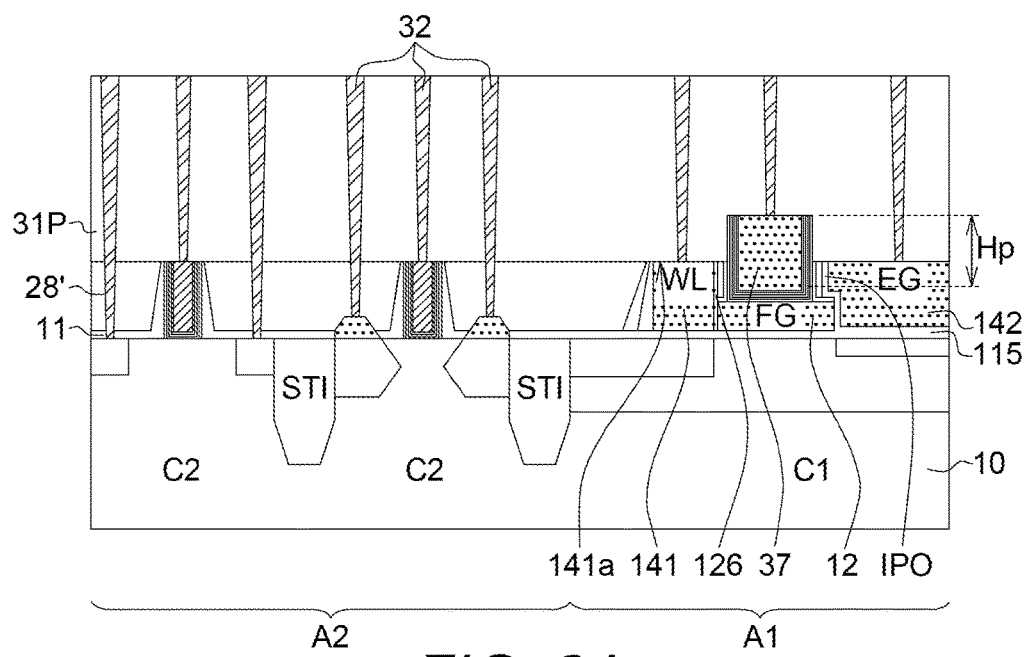

In FIG. 2I and FIG. 2J, the top surface of the gate electrode (such as metal gate HK) is substantially aligned (coplanar) with the top surfaces 124a of the CG spacers 124. Also, comparing the gate electrode (such as metal gate HK) of the second cell C2 and the gates of the first cell C1, the top surface 37a of the control gate 37 and the top surface 35a of the inter-gate dielectric layer 35 are higher than the top surface of the metal gate MG of the second cell C2.

According to the aforementioned descriptions, the structure of the embodied semiconductor device (as shown in FIG. 1, FIG. 2I and FIG. 2J) has a control gate 37 surrounded by the inter-gate dielectric layer (ex: an ONO layer) 35; for example, the sidewalls 37b and the bottom surface 37c of the control gate 37 are enclosed by the inter-gate dielectric layer 35. Also, the top surface 35a of the inter-gate dielectric layer 35 is aligned (or coplanar) with the top surface 37a of the control gate 37. The embodiment of the present disclosure can be applied to manufacture a semiconductor device including logic cells (with 28 nm HKMG or Fin-FET) and flash memory cells having no-damaged gates in the different regions. According to the structural design and the manufacturing method of the embodiment, it is no need to consider the gate height lose or damage of the flash memory cells (first cells) during formation of the logic cells (second cells)(such as removing dummy poly, filling metal material, followed by polishing) because of the existence of the dummy control gates of the flash cells. After formation of HKMG of the logic cell is completed, the dummy control gate in the flash cell is removed, and a formal control gate with a sufficient height as well as the complete profile can be re-built (CG-last).

The manufacturing processes for forming the logic cells in the second area cause no damage to the control gates of the flash memory cells. Accordingly, the control gate of the flash memory cell in the first area would be free of damage and possess complete gate profile and height, no matter what gate height difference between the first and second cells. Additionally, besides complete gate profile and sufficient gate height of the cells, the embodied design is compatible with the current fabrication process of the flash memory devices, which is suitable for mass production.

Other embodiments with different configurations of known elements in the logic devices or flash devices can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications without departing from the spirit of the disclosure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device with split gate flash memory cell structure, comprising:
   a substrate having a first area and a second area;
   at least a first cell formed in the first area, and the first cell comprising:
      a first dielectric layer formed on the substrate;
      a floating gate (FG), a word line (WL) and an erase gate formed on the first dielectric layer, wherein the floating gate is positioned between the word line and the erase gate;
      an interlayer dielectric (ILD) layer formed on the word line and the erase gate, wherein the ILD layer has a trench exposing the floating gate;
      an inter-gate dielectric layer formed in the trench as a liner; and
      a control gate (CG) formed in the trench and surrounded by the inter-gate dielectric layer; and
   at least a second cell formed in the second area, wherein a top surface of the inter-gate dielectric layer and a top surface of the control gate are higher than a top surface of a gate electrode of said at least the second cell, and wherein a top surface of the erase gate of said at least the first cell is parallel to the substrate and also parallel to and aligned with the top surface of the gate electrode of said at least the second cell.

2. The semiconductor device according to claim 1, wherein the top surface of the inter-gate dielectric layer is aligned with the top surface of the control gate.

3. The semiconductor device according to claim 1, wherein the first cell further comprises CG spacers formed on the floating gate and abutting opposite sidewalls of the inter-gate dielectric layer, and the ILD layer is formed on top surfaces of the CG spacers.

4. The semiconductor device according to claim 3, wherein the top surface of the inter-gate dielectric layer and the top surface of the control gate are higher than the top surfaces of the CG spacers.

5. The semiconductor device according to claim 3, wherein the top surfaces of the CG spacers are aligned with a top surface of the word line and the top surface of the erase gate.

6. The semiconductor device according to claim 3, wherein a height of the CG is at least about two times of a height of the CG spacers.

7. The semiconductor device according to claim 3, wherein the first cell further comprises a WL spacer formed between the word line and the floating gate, and a top surface of the WL spacer is aligned with the top surfaces of the CG spacers.

8. The semiconductor device according to claim 3, wherein the second cell comprises the gate electrode formed above the substrate, and the top surface of the gate electrode is aligned with the top surfaces of the CG spacers.

9. The semiconductor device according to claim 1, wherein the interlayer dielectric (ILD) layer formed on the word line and the erase gate directly contacts opposite sidewalls of the inter-gate dielectric layer.

10. The semiconductor device according to claim 1, wherein the inter-gate dielectric layer is an oxide-nitride-oxide layer, and the inter-gate dielectric layer directly contacts opposite sidewalls and a bottom surface of the control gate.

11. A method for manufacturing a semiconductor device with split gate flash memory cell structure, comprising:
   providing a substrate having a first area and a second area;
   forming at least a first cell in the first area, and the first cell comprising:
      a first dielectric layer formed on the substrate;
      a floating gate (FG), a word line (WL) and an erase gate formed on the first dielectric layer, wherein the floating gate is positioned between the word line and the erase gate;
      an interlayer dielectric (ILD) layer formed on the word line and the erase gate, wherein the ILD layer has a trench exposing the floating gate;
      an inter-gate dielectric layer formed in the trench as a liner; and
      a control gate (CG) formed in the trench and surrounded by the inter-gate dielectric layer; and
   forming at least a second cell comprising a gate electrode in the second area, wherein a top surface of the inter-gate dielectric layer and a top surface of the control gate are higher than a top surface of the gate electrode of said at least the second cell, and wherein a top surface of the erase gate of said at least the first cell is parallel to the substrate and also parallel to and aligned with the top surface of the gate electrode of said at least the second cell.

12. The method according to claim 11, wherein forming at least the first cell in the first area comprises:
   forming the floating gate (FG) on the first dielectric layer;
   forming a dummy control gate with a first height above the FG, and an oxide layer disposed between the dummy control gate and the FG;
   defining the word line, the erase gate and the dummy control gate with a second height, wherein the second height is smaller than the first height;
   forming the ILD layer on the word line, the erase gate and the dummy control gate with the second height; and
   defining the trench in the ILD layer to remove the dummy control gate with the second height as well as the oxide layer, so as to expose a top surface of the floating gate;
   forming the inter-gate dielectric layer in the trench; and
   forming the control gate (CG) in the trench.

13. The method according to claim 12, wherein before forming the ILD layer, said step of forming at least the first cell in the first area further comprises:
   forming CG spacers on the floating gate and abutting opposite sidewalls of the dummy control gate with the first height;
   depositing a first conductive layer on the first dielectric layer, wherein the dummy control gate with the first height, the floating gate and the CG spacers are embedded in the first conductive layer; and
   polishing the first conductive layer until defining the word line and the erase gate with predetermined heights, wherein the dummy control gate has the second height.

14. The method according to claim 13, wherein said step of forming at least the second cell comprising the gate electrode formed above the substrate is performed after polishing the first conductive layer and before formation of the ILD layer.

15. The method according to claim 13, wherein steps of forming the control gate (CG) in the trench comprises:
   depositing a second conductive layer on the inter-gate dielectric layer and fully filling the trench; and
   polishing the second conductive layer until portion of the inter-gate dielectric layer on the ILD layer being removed, so as to form the control gate.

16. The method according to claim 13, wherein the top surface of the inter-gate dielectric layer and the top surface of the control gate are higher than the top surfaces of the CG spacers.

17. The method according to claim 11, wherein the top surface of the inter-gate dielectric layer is aligned with the top surface of the control gate.

\* \* \* \* \*